(12) United States Patent
Azadet

(10) Patent No.: US 9,787,459 B2
(45) Date of Patent: Oct. 10, 2017

(54) NON-LINEAR INTERFERENCE CANCELLATION FOR WIRELESS TRANSCEIVERS

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 14/230,635

(22) Filed: Mar. 31, 2014

(65) Prior Publication Data

US 2014/0313946 A1    Oct. 23, 2014

Related U.S. Application Data

(60) Provisional application No. 61/812,858, filed on Apr. 17, 2013.

(51) Int. Cl.
*H04L 5/14* (2006.01)
*H04L 25/08* (2006.01)
(Continued)

(52) U.S. Cl.
CPC ........ *H04L 5/1461* (2013.01); *G06F 9/30036* (2013.01); *G06F 17/15* (2013.01);
(Continued)

(58) Field of Classification Search
CPC ........ H04B 1/62; H04B 1/0475; H04B 1/525; H04B 2001/0425; H04L 1/0043;
(Continued)

(56) References Cited

U.S. PATENT DOCUMENTS 4,884,265 A    11/1989 Schroeder et al.
4,896,287 A    1/1990 O'donnell et al.
(Continued)

OTHER PUBLICATIONS

"U.S. Appl. No. 14/230,607, Examiner Interview Summary mailed Feb. 9, 2016", 3 pgs.
(Continued)

*Primary Examiner* — Ian N Moore
*Assistant Examiner* — Brian T Le
(74) *Attorney, Agent, or Firm* — Schwegman Lundberg & Woessner, P.A.

(57) ABSTRACT

Non-linear interference cancellation techniques are provided for wireless transceivers. Non-linear reduction of interference of a transmit signal on a received signal in a transceiver device, comprises applying the transmit signal to a first non-linear system; applying the received signal to a second non-linear system; and subtracting an output of the first non-linear system output from an output of second non-linear system output to produce an interference mitigated received signal. The first non-linear system and/or the second non-linear system can be implemented using one or more of a Volterra series and a Generalized Memory Polynomial Model. System parameters of the first non-linear system and/or the second non-linear system are adapted to reduce a power of the interference mitigated received signal.

20 Claims, 2 Drawing Sheets

(51) Int. Cl.
| | |
|---|---|
| *G06F 17/50* | (2006.01) |
| *H04B 1/62* | (2006.01) |
| *H04L 1/00* | (2006.01) |
| *H04B 1/04* | (2006.01) |
| *G06F 17/15* | (2006.01) |
| *G06F 9/30* | (2006.01) |
| *H04L 25/03* | (2006.01) |
| *H04L 27/36* | (2006.01) |
| *H04J 11/00* | (2006.01) |
| *H04B 1/525* | (2015.01) |

(52) U.S. Cl.
CPC .......... *G06F 17/50* (2013.01); *G06F 17/5009* (2013.01); *H04B 1/0475* (2013.01); *H04B 1/525* (2013.01); *H04B 1/62* (2013.01); *H04J 11/004* (2013.01); *H04L 1/0043* (2013.01); *H04L 25/03012* (2013.01); *H04L 25/03343* (2013.01); *H04L 25/08* (2013.01); *H04L 27/367* (2013.01); *H04L 27/368* (2013.01); *H04B 2001/0425* (2013.01)

(58) Field of Classification Search
CPC ......... H04L 5/1461; H04L 5/14; H04L 25/08; H04L 25/03012; H04L 25/03343; H04L 27/367; H04L 27/368; H04J 11/004
See application file for complete search history.

(56) References Cited

U.S. PATENT DOCUMENTS

| | | | |
|---|---|---|---|
| 5,903,611 | A | 5/1999 | Schnabl et al. |
| 6,298,097 | B1 | 10/2001 | Shalom |
| 6,496,609 | B1 | 12/2002 | Walter |
| 6,587,514 | B1 | 7/2003 | Wright et al. |
| 6,798,843 | B1 | 9/2004 | Wright et al. |
| 6,801,086 | B1 | 10/2004 | Chandrasekaran |
| 7,058,369 | B1 | 6/2006 | Wright et al. |
| 7,242,725 | B2 | 7/2007 | Matsumoto et al. |
| 7,315,530 | B2 | 1/2008 | Castelain et al. |
| 7,471,739 | B1 | 12/2008 | Wright |
| 7,924,942 | B2 | 4/2011 | Rexberg |
| 8,331,509 | B2 | 12/2012 | Wang et al. |
| 8,498,591 | B1 | 7/2013 | Qian et al. |
| 9,225,501 | B2 | 12/2015 | Azadet |
| 2001/0050592 | A1 | 12/2001 | Wright et al. |
| 2002/0101938 | A1 | 8/2002 | Horaguchi et al. |
| 2002/0152248 | A1 | 10/2002 | Bentz |
| 2004/0001559 | A1 | 1/2004 | Pinckley et al. |
| 2004/0248516 | A1 | 12/2004 | Demir et al. |
| 2005/0116775 | A1 | 6/2005 | Mcbeath et al. |
| 2005/0136859 | A1 | 6/2005 | Anvari |
| 2005/0140438 | A1 | 6/2005 | Jin et al. |
| 2005/0243946 | A1 | 11/2005 | Chung et al. |
| 2005/0253745 | A1 | 11/2005 | Song et al. |
| 2006/0240786 | A1 | 10/2006 | Liu |
| 2007/0086134 | A1 | 4/2007 | Zweigle et al. |
| 2008/0008263 | A1 | 1/2008 | Keerthi et al. |
| 2008/0030388 | A1 | 2/2008 | Muck et al. |
| 2008/0123770 | A1 | 5/2008 | Copeland |
| 2008/0133982 | A1 | 6/2008 | Rawlins et al. |
| 2008/0144539 | A1 | 6/2008 | Sperlich et al. |
| 2009/0051425 | A1 | 2/2009 | Mehta et al. |
| 2009/0051426 | A1 | 2/2009 | Ba et al. |
| 2009/0256632 | A1 | 10/2009 | Klingberg et al. |
| 2010/0105338 | A1 | 4/2010 | Wang et al. |
| 2010/0138463 | A1 | 6/2010 | Azadet et al. |
| 2010/0138464 | A1 | 6/2010 | Azadet et al. |
| 2010/0138465 | A1 | 6/2010 | Azadet et al. |
| 2010/0138468 | A1 | 6/2010 | Azadet et al. |
| 2010/0316157 | A1 | 12/2010 | Bassam et al. |
| 2011/0080216 | A1 | 4/2011 | Mujica et al. |
| 2011/0149714 | A1* | 6/2011 | Rimini ............... H04B 1/525 370/201 |
| 2011/0228828 | A1* | 9/2011 | Wang ............... H04B 1/126 375/219 |
| 2012/0269292 | A1 | 10/2012 | Wang et al. |
| 2012/0269293 | A1 | 10/2012 | Peng et al. |
| 2013/0162349 | A1 | 6/2013 | Gao et al. |
| 2013/0243123 | A1 | 9/2013 | Bai |
| 2013/0336377 | A1* | 12/2013 | Liu ............... H04L 27/01 375/232 |
| 2014/0086361 | A1 | 3/2014 | Azadet et al. |
| 2014/0218107 | A1 | 8/2014 | Geng et al. |
| 2014/0314176 | A1 | 10/2014 | Azadet |
| 2014/0314181 | A1 | 10/2014 | Azadet |
| 2014/0316752 | A1 | 10/2014 | Azadet |
| 2014/0317376 | A1 | 10/2014 | Azadet |

OTHER PUBLICATIONS

"U.S. Appl. No. 14/230,607, Non Final Office Action mailed Nov. 19, 2015", 15 pgs.

"U.S. Appl. No. 14/230,607, Response filed Feb. 19, 2016 to Non Final Office Action mailed Nov. 19, 2015", 11 pgs.

"U.S. Appl. No. 14/230,622, Non Final Office Action mailed Apr. 14, 2015'", 22 pgs.

"U.S. Appl. No. 14/230,622, Notice of Allowance mailed Aug. 28, 2015", 14 pgs.

"U.S. Appl. No. 14/230,622, Response filed Jul. 14, 2015 to Non Final Office Action mailed Apr. 14, 2015", 14 pgs.

"Bilinear interpolation", [Online] retrieved from the internet <https://web.archive.org/web/20110921104425/http://en.wikipedia.org/wiki/Bilinear_interpolation>, (Sep. 21, 2011).

Jin, Minglu, et al., "A fast LUT predistorter for power amplifier in OFDM systems", in Personal, Indoor and Mobile Radio Communications, 2003. PIMRC 2003. 14th IEEE Proceedings on, vol. 2, No., (Sep. 7-10, 2003), 1894-1897.

Li, Hao, et al., "A Fast Digital Predistortion Algorithm for Radio-Frequency Power Amplifier Linearization With Loop Delay Compensation", in Selected Topics in Signal Processing, IEEE Journal of, vol. 3, No. 3, (Jun. 2009), 374-383.

Lu, Chao, et al., "A 24.7 dBm all-digital RF transmitter for muffin-lode broadband application sin 40nm CMOS", in Solid-State Circuits Conference Digest of Technical Papers (ISSCC), 2013 IEEE International, vol., No., (Feb. 17-21, 2013), 332-333.

Nagata, Y, "Linear amplification technique for digital mobile communications", in Vehicular Technology Conference, 1989, IEEE 39th, vol.,No. 1, (May 1989), 159-164.

"U.S. Appl. No. 14/168,621, Non Final Office Action mailed Oct. 20, 2016", 13 pgs.

"U.S. Appl. No. 14/230,607, Final Office Action mailed Jun. 2, 2016", 14 pgs.

"U.S. Appl. No. 14/255,491, Final Office Action mailed Nov. 3, 2016", 14 pgs.

"U.S. Appl. No. 14/255,491, Non Final Office Action mailed Jun. 16, 2016", 11 pgs.

"U.S. Appl. No. 14/255,491, Response filed Oct. 17, 2016 to Non Final Office Action mailed Jun. 16, 2016", 11 pgs.

Kim, et al., "Digital predistortion of wideband signals based on power amplifier model with memory", IEEE, (2001).

Pere Lluis, et al., "Multi Look-Up Table Digital Predistortion for RF Power Amplifier Linearization", Universität Politecnica de Catalunya, (2007).

"U.S. Appl. No. 14/168,621, Final Office Action mailed Mar. 29, 2017", 17 pgs.

"U.S. Appl. No. 14/168,621, Response filed Jan. 10, 2017 to Non Final Office Action mailed Oct. 20, 2016", 13 pgs.

"U.S. Appl. No. 14/255,491, Advisory Action mailed Mar. 22, 2017", 4 pgs.

"U.S. Appl. No. 14/255,491, Response filed Feb. 3, 2017 to Final Office Action mailed Nov. 3, 2016", 10 pgs.

"U.S. Appl. No. 14/255,491, Response filed Apr. 11, 2017 to Advisory Action mailed Mar. 22, 2017", 10 pgs.

"U.S. Appl. No. 14/168,621, Notice of Allowance dated Jul. 5, 2017", 16 pgs.

(56) References Cited

OTHER PUBLICATIONS

"U.S. Appl. No. 14/168,621, Response filed Jun. 26, 2017 to Final Office Action dated Mar. 29, 2017", 13 pgs.
"U.S. Appl. No. 14/255,491, Notice of Allowance dated Jun. 30, 2017", 11 pgs.

* cited by examiner

100

200

NON-LINEAR INTERFERENCE CANCELLATION FOR WIRELESS TRANSCEIVERS

CROSS-REFERENCE TO RELATED APPLICATIONS

The present application claims priority to U.S. Patent Provisional Application Ser. No. 61/812,858, filed Apr. 17, 2013, entitled "Digital Front End (DFE) Signal Processing," incorporated by reference herein.

FIELD OF THE INVENTION

The present invention is related to digital signal processing techniques and, more particularly, to techniques for interference cancellation in communication devices.

BACKGROUND OF THE INVENTION

In a wireless communication system, a transceiver is an important part that typically comprises a transmitter, a receiver, a duplexer and an antenna. The analog signal that is transmitted by the transmitter often interferes with the received signal and appears as a blocking signal to the receiver. Typically, the interference signal is leaked through the duplexer to the receiver, when isolation within the duplexer is not sufficient.

A number of techniques have been proposed or suggested for mitigating interference in wireless transceivers. U.S. Pat. No. 8,331,509, incorporated by reference herein, for example, discloses techniques for cancelling transmitter interference in a transceiver. While such existing techniques can effectively mitigate interference, they suffer from a number of limitations, which if overcome, could further improve the receiver sensitivity and performance and/or simplify the receiver design. For example, with existing techniques, interference cancellation is performed linearly. The dominant blocking effects, however, are non-linear.

A need therefore exists for improved techniques for interference cancellation in wireless transceiver communication devices.

SUMMARY OF THE INVENTION

Generally, non-linear interference cancellation techniques are provided for wireless transceivers. According to one aspect of the invention, non-linear reduction of interference of a transmit signal on a received signal in a transceiver device, comprises applying the transmit signal to a first non-linear system; applying the received signal to a second non-linear system; and subtracting an output of the first non-linear system output from an output of second non-linear system output to produce an interference mitigated received signal.

In one exemplary embodiment, the first non-linear system and/or the second non-linear system is implemented using one or more of a Volterra series and a Generalized Memory Polynomial Model. For example, the first non-linear system and/or the second non-linear system can be implemented using a Volterra series with reduced number of terms by pruning an original the Volterra series.

According to another aspect of the invention, system parameters of the first non-linear system and/or the second non-linear system are adapted to reduce a power of the interference mitigated received signal. A post-distorter optionally adjusts an adjustable non-zero linear gain to deliver a target non-zero signal power and only adapts the non-linear part of a post-distorter model. The system parameters can be obtained using one or more of a least squares algorithm, recursive least squares (RLS) and least mean square (LMS).

A more complete understanding of the present invention, as well as further features and advantages of the present invention, will be obtained by reference to the following detailed description and drawings.

DETAILED DESCRIPTION

Figure 1:
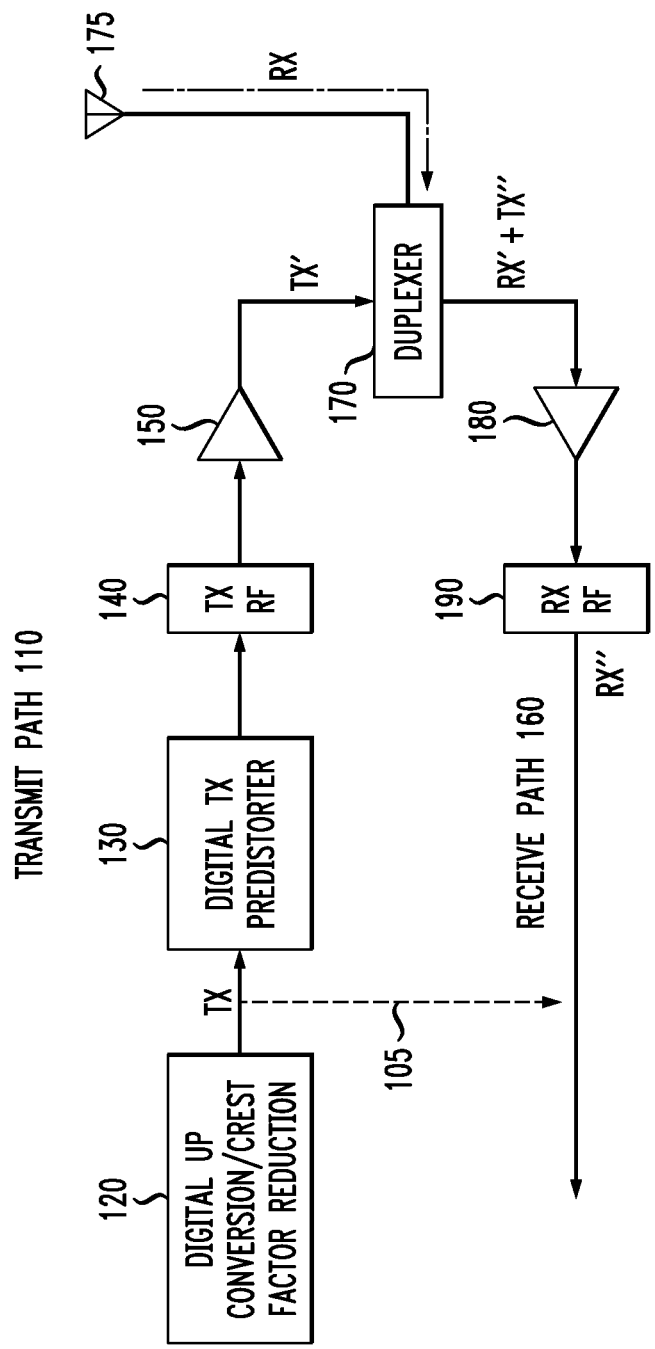
FIG. 1 illustrates portions of an exemplary conventional transceiver communication device in which interference is present.

Aspects of the present invention provide non-linear interference cancellation techniques for wireless transceivers. FIG. 1 illustrates portions of an exemplary conventional transceiver communication device 100. The exemplary conventional transceiver communication device 100 is part of any Frequency-Division Duplexing (FDD) communication system, where the transmit signal is in a separate band than the receive signal. The separation (or gap) between the transmit and receive frequency bands reduces the impact of the transmitter interference on the receiver, but does not eliminate the interference.

As shown in FIG. 1, the exemplary conventional transceiver communication device 100 comprises a transmit portion 110 and a receive portion 160 connected by a duplexer 170. The transmit signal is transmitted through the duplexer 170 and an antenna 175. The receive portion 160 receives a signal through the antenna 175 and the duplexer 170 and converts the received signal into a baseband signal.

As shown in FIG. 1, the transmit portion 110 comprises a digital up conversion (DUC) and crest factor reduction (CFR) stage 120, a digital pre-distorter (DPD) 130, a transmit (TX) Radio Frequency (RF) stage 140 and a power amplifier 150. Generally, the digital up converter in stage 120 performs digital up conversion to convert a digitized baseband signal to a radio frequency (RF). In addition, the crest factor reduction performed by stage 120 limits the peak-to-average ratio (PAR) of the transmitted signal. The digital pre-distortion stage 130 linearizes the power amplifier 150 to improve efficiency. The digital pre-distortion stage 130 efficiently reduces non-linear effects in a relatively narrow band (TX band but not RX band). Nonetheless, the power amplifier 150 will apply non-linear effects on the transmit signal TX, resulting in a signal TX'. Thus, the signal TX' is a non-linear function of the transmit signal TX.

In addition, as shown in FIG. 1, the exemplary receive portion 160 comprises a low noise amplifier 180 that amplifies the received signal, a receive (RX) RF stage 190 and a variable gain amplifier (VGA) 230 that varies its gain based on a control signal. As shown in FIG. 1, a non-linear interference channel 105 combines non-linearities of the TX and RX paths. The duplexer 170 will attenuate the transmit signal TX' at the output of the power amplifier 150 and produce an attenuated transmit signal TX" that serves as the blocker signal to the receive portion 160. The attenuated transmit signal TX" is a linear function of the transmit signal TX' at the output of the power amplifier 150.

The duplexer 170 will bandpass filter the antenna signal RX and produce a filtered received signal RX'. The attenuated transmit signal TX" adds up to the filtered received signal RX' at the duplexer to produce a combined signal RX'+TX". The combined signal RX'+TX" comprises the filtered received signal RX and the non-linear contribution of the transmit signal in the receive band filtered by the duplexer 170.

Due to the non-linear effects of the low noise amplifier 180, the signal RX" is a non-linear function of the combined signal RX'+TX", expressed as follows:

$$RX''=f(RX'+TX'')\sim f(RX'+g(TX))$$

where the function f expresses the non-linear effects of the receive portion 160. Likewise, the function g expresses the non-linear effects of the transmit portion 110.

The desired filtered receive signal RX' can be expressed in qualitative terms as follows:

$$RX'=f'(RX'')-g'(TX),$$

where the function f' is an estimate of the inverse $f^1$ of the receive path function f and the function g' is an estimate of the transmit path function g. It is noted that for ease of illustration, static non-linear models are employed. In practice, however, dynamic models (non-linearity with memory) may be used to more accurately describe the non-linear effects of the transmitter and the receiver, as would be apparent to a person of ordinary skill in the art.

In practice, the desired received signal RX' often has a low power level (e.g. −105 dBm) in the presence of a large blocker signal TX" on channel 105. The transmit signal TX can be very strong (e.g., in an exemplary base-station it is not uncommon to transmit at a power level close to 50 dBm). The duplexer 170 and receiver filter 190 attenuate the transmit signal by, for example, 50-60 dB, bringing the TX interference level to 0 to −10 dBm, which is still a high power interfering signal. In 3rd Generation Partnership Project (3GPP) Global System for Mobile Communication (GSM) Base Transceiver Station (BTS) specifications, for example, a blocker level of 0 dBm must be tolerated.

As noted above, the blocker signal TX" and received signal RX' mix non-linearly due to non-linearity of the receive path 160 and can, in some cases, transmitted signal components produce inter-modulation products that overlap with the signal frequency making the received signal RX' undetectable (i.e., blocking the signal). Thus, aspects of the present invention reduce the blocker signal in a non-linear fashion to improve the receiver performance. The non-linear interference cancelation techniques provided herein can be employed in any FDD transceiver, including wireless fidelity (WiFi) transceivers, cellular base-station transceiver systems and the user equipment/end-point cellular transceivers (e.g., handsets), as would be apparent to a person of ordinary skill in the art based on the present disclosure.

Figure 2:
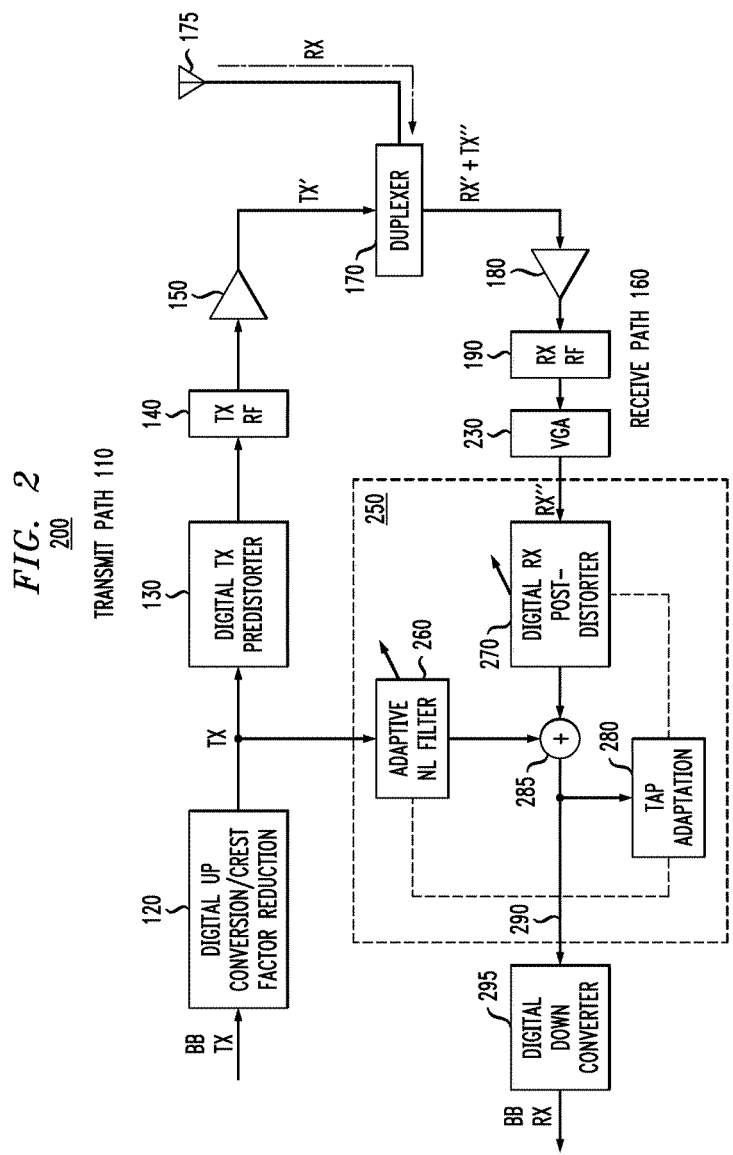
FIG. 2 illustrates portions of an exemplary transceiver communication device in which aspects of the present invention may be employed.

FIG. 2 illustrates portions of an exemplary transceiver communication device 200 in which aspects of the present invention may be employed. As shown in FIG. 2, the exemplary transceiver communication device 200 comprises a transmit portion 110 and a receive portion 160 connected by a duplexer 170, in a similar manner to FIG. 1. As shown in FIG. 2, the transmit portion 110 comprises a digital up conversion (DUC) and crest factor reduction (CFR) stage 120, a digital pre-distorter (DPD) 130, a transmit (TX) Radio Frequency (RF) stage 140 and a power amplifier 150, in a similar manner to FIG. 1. The exemplary receive portion 160 comprises a low noise amplifier 180 that amplifies the received signal and a receive (RX) RF stage 190, in a similar manner to FIG. 1. In addition, the exemplary receive portion 160 comprises a digital down converter 295 that was not shown in FIG. 1 that performs digital down conversion to convert a radio frequency (RF) signal to a digitized baseband (BB) signal, in a known manner.

In addition, in accordance with aspects of the invention, the exemplary receive portion 160 also includes a non-linear interference cancellation block 250. As shown in FIG. 2, the exemplary non-linear interference cancellation block 250 comprises an adaptive non-linear filter 260, a digital RX post-distorter 270, a tap adaptation block 280 and an adder 285.

Thus, as shown in FIG. 2, the transmit signal TX is input to a first non-linear system, the adaptive non-linear filter 260, and the receive signal RX' is input to a second non-linear system, the digital RX post-distorter 270. Thereafter, the output of the adaptive non-linear filter 260 is subtracted from the output of the digital RX post-distorter 270 to produce an interference mitigated RX signal 290.

Thus, the exemplary non-linear interference cancellation block 250 generates the interference mitigated RX signal 290. As discussed further below in a section entitled "Exemplary Filter Representations," the adaptive non-linear filter 260 and digital RX post-distorter 270 can be implemented, for example, as Volterra Series, Generalized Memory Polynomial (GMP) Model or another memory model. In one exemplary embodiment, the Volterra series employs a reduced number of terms by pruning the original said Volterra series.

The adaptive non-linear filter 260 implements the function g' to model the interference channel 105 comprising portions of the transmit path 110 and receive path 160 up to the adder 285. The digital RX post-distorter 270 implements the function f' to model the inverse of the non-linearity of the receive path 160. While the adaptive non-linear filter 260 requires a memory model (due to the amplifier), the digital RX post-distorter 270 can optionally employ a static model.

As discussed further below in a section entitled "Adaptation of Canceller," the tap adaptation block 280 identifies the parameters of the adaptive non-linear filter 260 and digital RX post-distorter 270 that provide a substantially minimum value at the output of the adder 285 (mean square error) using a least squares algorithm. In further variations, alternative algorithms can use, for example, recursive least squares (RLS) or least mean square (LMS) that achieve various trade-offs between complexity and conversion speed.

Adaptation of Canceller

As noted above, the exemplary non-linear interference cancellation block 250 aims to minimize the contribution of the interfering transmit signal TX" to the receiver input.

Aspects of the present invention recognize, however, that minimizing the following expression discussed above:

$$f'(RX'')-g'(TX)$$

leads to the functions f' and g' both going to zero, if the choice of the function f' is not constrained.

Thus, one exemplary implementation of the present invention separates out the linear part and non-linear parts of the function f', as follows:

$$f'(RX'')=a*RX''+f'_{NL}(RX'')$$

where a is an arbitrary linear gain value that prevents the function from going to zero.

Exemplary Non-Linear System Representations

Generally, a causal linear system with memory can be expressed as:

$$y(t)\int_{-\infty}^{\infty} h(\tau)x(t-\tau)d\tau$$

In addition, a static weakly non-linear system without memory can be modeled using a polynomial expression:

$$y(t)=\Sigma_{k=1}^{\infty} a_k [x(t)]^k$$

The Volterra series can be considered as a combination of the two:

$$y(t)=\Sigma_{k=1}^{K} y_k(t)$$

$$y_k(t)=\int_{-\infty}^{\infty} \ldots \int_{-\infty}^{\infty} h_k(\tau_1, \ldots, \tau_k) \ldots x(t-\tau_k)d\tau_1 \ldots d\tau_k$$

In the discrete domain, the Volterra Series can be expressed as follows:

$$y(n)=\Sigma_{k=1}^{K} y_k(n)$$

$$y_k(n)=\Sigma_{m_1=0}^{M-1} \ldots \Sigma_{m_k=0}^{M-1} h_k(m_1, \ldots, m_k) \Pi_{l=1}^{k} x(n-m_l)$$

The complexity of a Volterra series can grow exponentially making its use impractical in many common applications, such as DPD. Thus, a number of simplified models for non-linear systems have been proposed. For example, a memory polynomial is a commonly used model:

$$y_{MP}(n) = \sum_{k=1}^{K} \sum_{m=0}^{M-1} h_k(m, \ldots, m) x^k(n-m)$$

$$= \sum_{k=0}^{K-1} \sum_{m=0}^{M-1} h_{k,m} x(n-m) |x(n-m)|^k$$

Another simplified model referred to as a Generalized Memory Polynomial Model, can be expressed as follows (where M indicates the memory depth and K indicates the polynomial order):

$$y(n) = \sum_{m=0}^{M-1} \sum_{l=0}^{M-1} \sum_{k=0}^{K-1} h_{k,m,l} |x(n-l)|^k x(n-m)$$

$$y(n) = \sum_{m=0}^{M-1} \sum_{l=0}^{M-1} x(n-m) \sum_{k=0}^{K-1} h_{k,m,l} |x(n-l)|^k$$

CONCLUSION

While exemplary embodiments of the present invention have been described with respect to digital logic blocks and memory tables within a digital processor, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

I claim:

1. A method for non-linear reduction of interference of a transmit signal and a received signal in a transceiver device, comprising:

applying said transmit signal to a first non-linear system wherein the first non-linear system comprises a non-linear filter operating on the transmit signal and wherein the first non-linear system is configured to model a non-linearity of a transmit (TX) chain of the transceiver device using a first memory model;

applying said received signal to a second non-linear system wherein the second non-linear system comprises a non-linear post distortion filter operating on the received signal and the second non-linear system is configured to model an inverse of a non-linearity in a receive (RX) chain using a second memory model;

adapting first parameters of the first non-linear system using tap adaptation circuitry;

adapting second parameters of the second non-linear system using the tap adaptation circuitry; and subtracting an output of said first non-linear system from an output of said second nonlinear system to produce an interference mitigated received signal;

wherein the first parameters and the second parameters are adapted to provide a least squares algorithm generated value for the interference mitigated received signal, and wherein the second parameters comprise an arbitrary linear gain value to prevent the interference mitigated received signal from going to zero.

2. The method of claim 1, wherein one or more of said first non-linear system and said second non-linear system is a non-linear system with memory.

3. The method of claim 1, wherein one or more of said first non-linear system and said second non-linear system is implemented using one or more of a Volterra series and a Generalized Memory Polynomial Model.

4. The method of claim 1, wherein one or more of said first non-linear system and said second non-linear system is implemented using a Volterra series with reduced number of terms by pruning an original of said Volterra series.

5. The method of claim 1, wherein system parameters of one or more of said first non-linear system and said second non-linear system are adapted to reduce a power of said interference mitigated received signal.

6. The method of claim 5, wherein a non-zero linear gain in the non-linear post-distortion filter is adjusted to deliver a target non-zero signal power; and wherein a non-linear part of the non-linear post-distortion filter is adapted to reduce the power of said interference mitigated received signal.

7. The method of claim 5, wherein the system parameters are obtained using one or more the least squares algorithm, recursive least squares (RLS) and least mean square (LMS).

8. The method of claim 1 wherein the first memory model comprises a first Generalized Memory Polynomial (GMP) Model, and
wherein the second memory model comprises a Volterra Series Model.

9. The method of claim 1 wherein the inverse of the non-linearity in the receive (RX) chain is modeled as a function f' with for the received signal RX" as:

$$f'(RX")=a*RX"+f'_{NL}(RX")$$

where a is the arbitrary linear gain value to prevent the interference mitigated received signal from going to zero, and wherein f'NL is a non-linear portion of the function f'.

10. A system for non-linear reduction of interference of a transmit signal and a received signal in a transceiver device, comprising:
a memory; and
at least one hardware device, coupled to the memory, operative to:
apply said transmit signal to a first non-linear system wherein the first non-linear system comprises a non-linear filter operating on the transmit signal and wherein the first non-linear system is configured to model a non-linearity of a transmit (TX) chain of the transceiver device using a first memory model;
apply said received signal to a second non-linear system wherein the second non-linear system comprises a non-linear post distortion filter operating on the received signal and the second non-linear system is configured to model an inverse of a non-linearity in a receive (RX) chain using a second memory model;
adapting first parameters of the first non-linear system using tap adaptation circuitry;
adapting second parameters of the second non-linear system using the tap adaptation circuitry;
subtract an output of said first non-linear system from an output of said second non-linear system to produce an interference mitigated received signal;
wherein the first parameters and the second parameters are adapted to provide a least squares algorithm generated value for the interference mitigated received signal, and wherein the second parameters comprise an arbitrary linear gain value to prevent the interference mitigated received signal from going to zero.

11. The system of claim 10, wherein one or more of said first non-linear system and said second non-linear system is implemented using one or more of a Volterra series and a Generalized Memory Polynomial Model.

12. The system of claim 10, wherein one or more of said first non-linear system and said second non-linear system is implemented using a Volterra series with reduced number of terms by pruning an original of said Volterra series.

13. The system of claim 10, wherein system parameters of one or more of said first non-linear system and said second non-linear system are adapted to reduce a power of said interference mitigated received signal.

14. The system of claim 13, wherein a non-zero linear gain in the non-linear post-distortion filter is adjusted to deliver a target non-zero signal power; and
wherein a non-linear part of the non-linear post-distortion filter is adapted to reduce the power of said interference mitigated received signal.

15. The system of claim 13, wherein the system parameters are obtained using one or more of the least squares algorithm, recursive least squares (RLS) and least mean square (LMS).

16. A system for non-linear reduction of interference of a transmit signal and a received signal in a transceiver device, comprising:
first circuitry to apply said transmit signal to a first non-linear system wherein the first nonlinear system comprises a non-linear filter operating on the transmit signal and wherein the first non-linear system is configured to model a non-linearity of a transmit (TX) chain of the transceiver device using a first memory model;
second circuitry to apply said received signal to a second non-linear system wherein the second non-linear system comprises a non-linear post distortion filter operating on the received signal and the second non-linear system is configured to model an inverse of a non-linearity in a receive (RX) chain using a second memory model;
fourth circuitry comprising tap adaptation circuitry to adapt first parameters of the first non-linear system and second parameters of the second non-linear system; and
third circuitry to subtract an output of said first non-linear system from an output of said second non-linear system to produce an interference mitigated received signal;
wherein the first parameters and the second parameters are adapted to provide a least squares algorithm generated value for the interference mitigated received signal, and wherein the second parameters comprise an arbitrary linear gain value to prevent the interference mitigated received signal from going to zero.

17. The system of claim 16, wherein one or more of said first non-linear system and said second non-linear system is a non-linear system with memory.

18. The system of claim 16, wherein one or more of said first non-linear system and said second non-linear system is implemented using one or more of a Volterra series and a Generalized Memory Polynomial Model.

19. The system of claim 16, wherein one or more of said first non-linear system and said second non-linear system is implemented using a Volterra series with reduced number of terms by pruning an original of said Volterra series.

20. The system of claim 16, wherein system parameters of one or more of said first non-linear system and said second non-linear system are adapted to reduce a power of said interference mitigated received signal.

* * * * *

UNITED STATES PATENT AND TRADEMARK OFFICE
CERTIFICATE OF CORRECTION

PATENT NO. : 9,787,459 B2
APPLICATION NO. : 14/230635
DATED : October 10, 2017
INVENTOR(S) : Kameran Azadet Page 1 of 1

It is certified that error appears in the above-identified patent and that said Letters Patent is hereby corrected as shown below:

On the Title Page

On page 3, in Column 1, item (56) under "Other Publications", Line 1, delete "Jun. 26, 2017" and insert --May 26, 2017-- therefor In the Claims In Column 6, Line 30, in Claim 1, delete "post distortion" and insert --post-distortion-- therefor In Column 6, Line 39, in Claim 1, delete "nonlinear" and insert --non-linear-- therefor In Column 7, Line 2, in Claim 7, after "more", insert --of--

In Column 7, Line 6, in Claim 8, delete "Model," and insert --Model;-- therefor

In Column 7, Line 16, in Claim 9, delete "fNL" and insert --f$_{NL}$-- therefor

In Column 7, Line 32, in Claim 10, delete "post distortion" and insert --post-distortion-- therefor In Column 8, Line 17, in Claim 16, delete "nonlinear" and insert --non-linear-- therefor In Column 8, Line 25, in Claim 16, delete "post distortion" and insert --post-distortion-- therefor Signed and Sealed this
Twelfth Day of January, 2021

Andrei Iancu
*Director of the United States Patent and Trademark Office*